United States Patent
Tamaki

(10) Patent No.: US 10,916,454 B2
(45) Date of Patent: Feb. 9, 2021

(54) METHOD OF STRIPPING A PHOTORESIST, AND METHOD OF MANUFACTURING A SEMICONDUCTOR DEVICE

(71) Applicant: ABLIC Inc., Chiba (JP)

(72) Inventor: Ichiro Tamaki, Chiba (JP)

(73) Assignee: ABLIC INC.

( * ) Notice: Subject to any disclaimer, the term of this patent is extended or adjusted under 35 U.S.C. 154(b) by 0 days.

(21) Appl. No.: 16/676,148

(22) Filed: Nov. 6, 2019

(65) Prior Publication Data
US 2020/0075357 A1   Mar. 5, 2020

Related U.S. Application Data

(62) Division of application No. 15/264,124, filed on Sep. 13, 2016, now Pat. No. 10,504,755.

(30) Foreign Application Priority Data

Sep. 24, 2015   (JP) .................................. 2015-187340

(51) Int. Cl.
H01L 21/67 (2006.01)
H01L 21/02 (2006.01)

(52) U.S. Cl.
CPC .... H01L 21/67069 (2013.01); H01L 21/6704 (2013.01); H01L 21/67057 (2013.01); H01L 21/67086 (2013.01); *H01L 21/02052* (2013.01)

(58) Field of Classification Search
CPC ....... H02M 7/53873; H02M 2001/007; H02M 2001/0058; H02J 3/381; H02J 3/46;
(Continued)

(56) References Cited

U.S. PATENT DOCUMENTS 6,699,330 B1 * 3/2004 Muraoka .................. B08B 3/08
  134/19
7,219,677 B1 * 5/2007 Jackson ............ H01L 21/02101
  134/100.1
(Continued)

FOREIGN PATENT DOCUMENTS

JP    4256318    9/1992
JP    11174692   7/1999
(Continued)

OTHER PUBLICATIONS

Abstract, Publication No. JP 11-174692, Publication Date Jul. 2, 1999.

*Primary Examiner* — Lan Vinh
(74) *Attorney, Agent, or Firm* — Adams & Wilks

(57) ABSTRACT

A method of reducing resist residue on a semiconductor substrate includes introducing ozone gas into a chemical solution effective to dissolve resist residue adhered to the semiconductor substrate. The chemical solution is circulated through a processing tank where the semiconductor substrate is immersed in the chemical solution and through a first circulation path having a first pump and a first filter. After dissolution of the resist in the processing tank, the chemical solution is circulated through a second circulation path having a second pump and a second filter and returned to the processing tank. The first filter is cleaned by circulating the chemical solution through a third circulation path that includes the first pump and the first filter while introducing ozone gas into the chemical solution. The third circulation path is a closed loop path that excludes the processing tank, the second pump and the second filter.

6 Claims, 4 Drawing Sheets

(58) Field of Classification Search
CPC ........... H01L 21/67069; H01L 21/6704; H01L 21/67057; H01L 21/02052; H01L 21/67086
USPC ..................... 134/1.1, 1.2, 1.3; 438/745, 750
See application file for complete search history.

(56) References Cited

U.S. PATENT DOCUMENTS

| | | | |
|---|---|---|---|
| 2003/0058982 A1 | 3/2003 | Nagase et al. | 376/310 |
| 2004/0221880 A1 | 11/2004 | Tomita et al. | 134/95.1 |
| 2007/0123052 A1* | 5/2007 | Kashkoush | G03F 7/428 |
| | | | 438/725 |
| 2008/0006295 A1 | 1/2008 | Miyazaki et al. | 134/3 |
| 2013/0233357 A1 | 9/2013 | Minamihonoki et al. | 134/34 |
| 2014/0116464 A1 | 5/2014 | Nagai et al. | 134/3 |

FOREIGN PATENT DOCUMENTS

| | | |
|---|---|---|
| JP | 2004327826 | 11/2004 |
| JP | 2008016620 | 1/2008 |
| JP | 2012204546 | 10/2012 |
| JP | 2014107478 | 6/2014 |
| JP | 2015020100 | 2/2015 |
| WO | 2013008605 | 1/2013 |

* cited by examiner

METHOD OF STRIPPING A PHOTORESIST, AND METHOD OF MANUFACTURING A SEMICONDUCTOR DEVICE

CROSS REFERENCE TO RELATED APPLICATION

This application is a division of U.S. application Ser. No. 15/264,124 filed Sep. 13, 2016, which claims the benefit of Japanese Patent Application No. 2015-187340 filed Sep. 24, 2015, which is hereby incorporated by reference, and priority thereto for common subject matter is hereby claimed.

BACKGROUND OF THE INVENTION

1. Field of the Invention

The present invention relates to a semiconductor-substrate processing apparatus used in photolithography, which is a process of manufacturing a semiconductor device, and mainly in a step of stripping a photoresist that is applied onto a semiconductor substrate surface and a step of removing organic substances adhered onto the semiconductor substrate surface.

2. Description of the Related Art

In the manufacturing of a semiconductor device through use of a semiconductor substrate, there has been performed a step of stripping a photoresist applied onto a semiconductor substrate surface off from the substrate surface. There has also been performed processing of immersing the semiconductor substrate into a chemical solution, which is made by heating a mixed liquid of sulfuric acid and a hydrogen peroxide solution up to a temperature of 120 degrees Celsius or more, in order to remove organic substances adhered onto the semiconductor substrate surface, and then performing cleaning using pure water and drying. This is a technology using the fact that substances on the semiconductor substrate surface, e.g., the photoresist are dissolved or stripped by substances having extremely high oxidizability, e.g., peroxydisulfuric acid that is generated through reaction between the sulfuric acid and the hydrogen peroxide solution.

Further, as an alternative measure, there has been proposed a technology that attains the same effect as that achieved by the mixed liquid formed of the sulfuric acid and the hydrogen peroxide solution. In this technology, there is used a substance having high oxidizability, e.g., peroxydisulfuric acid that is generated through reaction between sulfuric acid and ozone gas. The reaction is caused by injecting the ozone gas into a high-temperature sulfuric acid and then introducing the sulfuric acid and the ozone gas into a processing tank (see, for example, Japanese Patent Application Laid-open H11-174692).

However, when processing is performed to the semiconductor substrate in the apparatus disclosed in Japanese Patent Application Laid-open H11-174692, a problem arises as described below. In particular, at first, the photoresist film that is stripped is collected by a filter, but a large amount of resist peels off right after the stripping. Therefore, there is a fear in that the filter may be contaminated by the resist, thereby lowering its collecting performance. This leads to resist that cannot be collected being adhered to the wafer again in form of fine particles. Further, there is a limit on concentration in which ozone can be dissolved in the chemical solution using a permeation membrane. Therefore, there is a problem in that parts of the resist may be difficult to strip depending on the pattern that is transferred onto the semiconductor substrate surface, and that the resist may remain on the substrate surface even when the processing is continued for a long time.

SUMMARY OF TEE INVENTION

The present invention is provided in order to solve the problems described above, and an aim thereof is to prevent a semiconductor substrate surface from being affected by contamination of a filter, while diffusing ozone directly into a processing tank and securing a sufficient concentration of a chemical solution in a semiconductor-substrate processing apparatus.

According to one embodiment of the present invention, circulation lines are arranged for a tank for performing processing on a semiconductor substrate, and two circulation pumps and two filters are arranged on those circulation lines. Further, a gas introducing jig configured to dissolve ozone gas into a chemical solution is incorporated in those circulation lines.

Through use of the measures described above, the number of fine particles that remain on the semiconductor substrate surface after the resist stripping processing can be reduced.

DETAILED DESCRIPTION OF THE INVENTION

Figure 1:
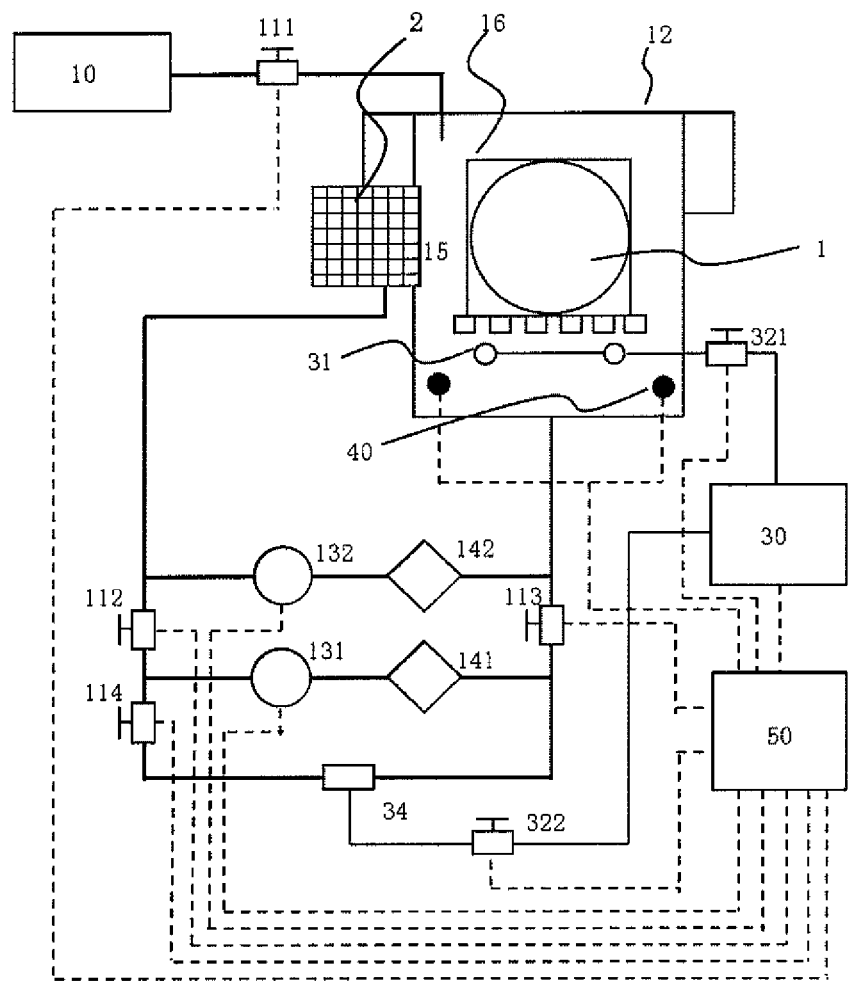
FIG. 1 is a schematic view of a semiconductor-substrate processing apparatus according to an embodiment of the present invention.

Now, referring to the drawings, an embodiment of the present invention is described.

FIG. 1 is a schematic view of a semiconductor-substrate processing apparatus according to an embodiment of the present invention.

A processing tank 12 which is used to hold chemical solutions for processing includes a heater 40, an ozone gas diffusing jig 31, and a duckboard-shaped jig 15. A wafer-holding jig 16 configured to accommodate a semiconductor substrate 1 may be placed on the duckboard-shaped jig 15 to perform chemical solution processing. A chemical solution injecting device 10 configured to perform injection of the chemical solution is connected to the processing tank 12 via a chemical solution injecting valve 111 and a pipe. A plurality of semiconductor devices 2 are arranged in a matrix in place on a surface of the semiconductor substrate 1.

Further, a plurality of pipes for the circulation of the chemical solution is connected to the processing tank 12. The chemical solution overflows from an upper portion of the processing tank 12, and passes through a first switching valve 112, a second switching valve 113, and a third switching valve 114, a first filter 141 and a second filter 142, and a first circulation pump 131 and a second circulation pump 132, to return into the processing tank 12. The first circulation pump 131 and the first filter 141 are connected to each other in series, and the second circulation pump 132 and the second filter 142 are also connected to each other in series. Further, the first circulation pump 131 and the first filter 141, which are connected to each other in series, are connected in parallel to the second circulation pump 132 and the second filter 142, which are connected to each other in series.

The first switching valve 112 is arranged between the first circulation pump 131 and the second circulation pump 132, and the second switching valve 113 is arranged between the first filter 141 and the second filter 142. Further, an ozone gas generating device 30 configured to inject ozone gas into the processing tank 12 is connected to the processing tank 12 via a first ozone gas injecting valve 321 and a pipe. The ozone gas generating device 30 is also connected to a chemical solution circulating system at a gas introducing jig 34 via a second ozone gas injecting valve 322 and a pipe. The chemical solution injecting valves, the heater, the switching valves, the circulation pumps, the ozone gas injecting valves, and other devices described above are controlled by a control unit 50.

Next, referring to FIG. 1, processing performed on the semiconductor substrate according to the present invention is described as an example.

The semiconductor substrate 1 is accommodated in the wafer-holding jig 16, e.g., a cassette, to thereby be introduced into the processing tank 12. The duckboard-shaped jig 15 for placing the wafer-holding jig 16 is accommodated in the processing tank 12. The wafer holding jig 16 is placed on the duckboard-shaped jig 15, to thereby hold the semiconductor substrate. First, the wafer holding jig 16 is conveyed into the processing tank 12 by a conveying robot (not shown).

The chemical solution is supplied into the processing tank 12 from the chemical solution injecting device 10 through the opening and closing of the chemical solution injecting valve 111. Sulfuric acid is mainly used for the chemical solution. The chemical solution is accumulated in the processing tank 12 before the semiconductor substrate 1 is conveyed into the processing tank 12. The accumulated chemical solution is circulated by the first circulation pump 131, and the circulating chemical solution is filtered through the first filter 141. At this time, the opening and closing states of the valves are as follows, that is, the first switching valve 112: open, the second switching valve 113: open, the third switching valve 114: closed.

The heater 40 configured to heat the chemical solution is arranged inside the processing tank 12. The heater 40 is configured to heat the chemical solution that is accumulated in the processing tank 12 up to a predetermined temperature. Further, the ozone gas diffusing jig 31 configured to diffuse the ozone gas into the processing tank 12 is mounted to a lower portion of the duckboard-shaped jig 15 in the processing tank 12. By opening the first ozone gas injecting valve 321, gas generated in the ozone gas generating device 30 is diffused through the ozone gas diffusing jig 31 into the chemical solution that is accumulated in the processing tank 12. The entire processing sequence described above is unitarily controlled by the control unit 50. This control is defined by a so-called recipe, and the control unit is configured to perform control based on instructions set in this recipe. An example of a processing sequence is described below.

Step 1

The sulfuric acid is injected into the processing tank 12 up to a fixed quantity. It is desired that the concentration of the sulfuric acid used at this time have the highest concentration value (96% or more) among sulfuric acid that is available for use in semiconductor manufacturing.

Step 2

The sulfuric acid that is injected into the processing tank 12 is heated by the heater 40 up to a preset temperature. It is desired that a temperature of the sulfuric acid at this time be 140 degrees Celsius or more.

Step 3

The semiconductor substrate 1 that has the photoresist adhered thereto is immersed into the processing tank 12 filled with the sulfuric acid.

Step 4

The ozone gas is introduced into the processing tank 12 through the ozone gas diffusing jig 31. It is desired that a flow rate of the ozone gas be from 10 L to 15 L. When gas having a flow rate exceeding that flow rate is introduced, there is a fear in that, due to gas current of the gas in the liquid, the semiconductor substrate 1 may vibrate in the chemical solution, leading to a breakage of the substrate.

Figure 2:
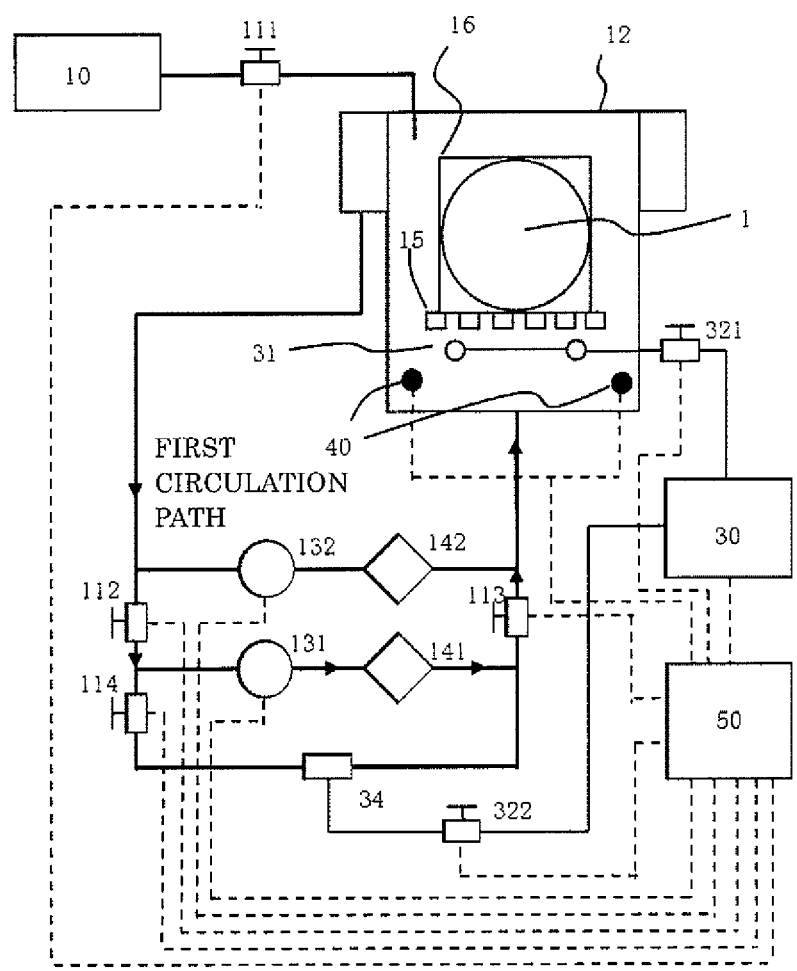
FIG. 2 is a schematic view of the semiconductor-substrate processing apparatus according to the embodiment of the present invention with a first circulation direction of a chemical solution.

A circulation path of the chemical solution at this time is illustrated in FIG. 2. The arrows of FIG. 2 are for indicating the direction the chemical solution flows. This circulation path is referred to as a first circulation path. At this time, the opening and closing of the valves are set to be as follows: the first switching valve 112 is open; the second switching valve 113 is open; and the third switching valve 114 is closed.

Step 5

The semiconductor substrate 1 is immersed into the processing tank 12 until a preset time. It is desired that immersing time be from about 5 minutes to about 10 minutes. When the immersing time is too short, a large amount of resist remains on the surface. Meanwhile, when the immersing time is too long, productivity is lowered. At this time, the resist is beginning to be stripped in the processing tank 12. When the processing is continued for about 10 minutes, the color of the chemical solution becomes nearly colorless, and the color of the filter changes into dark brown due to stripped pieces of the resist.

Step 6

Figure 3:
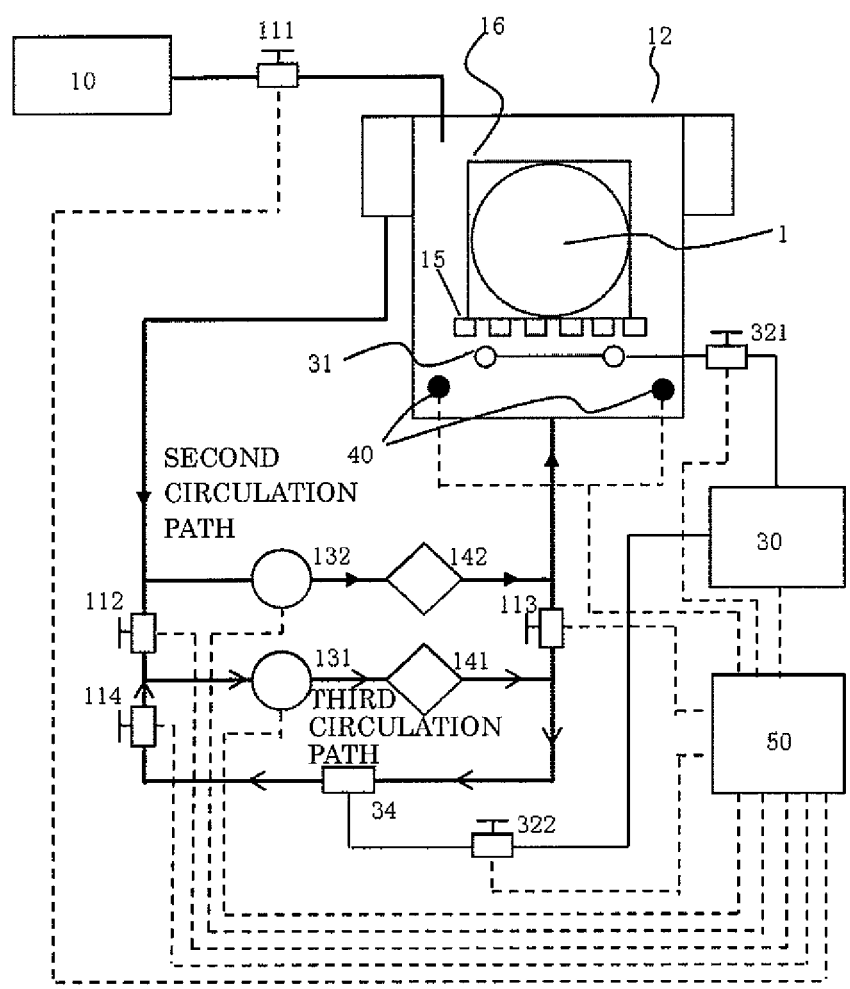
FIG. 3 is a schematic view of the semiconductor-substrate processing apparatus according to the embodiment of the present invention with a second circulation direction of the chemical solution.

When the preset time has come, the setting of the valves is changed as follows: the first switching valve 112 is closed; the second switching valve 113 is closed; and the third switching valve 114 is open. Then, the circulation path of the chemical solution is changed as illustrated in FIG. 3. The chemical solution from the processing tank 12 passes through the second filter 142, which is not contaminated by the resist, and then circulates to the processing tank 12. Therefore, there is hardly any contamination of the semiconductor substrate 1 due to the resist. This path is referred to as a second circulation path. At this point of time, the remaining resist is diminished to an admissible level of amount, and thus there is no fear of the filter being contaminated by the resist.

Further, the fine particles of the resist that are collected by the first filter 141 are also dissolved into a reaction solution formed of the sulfuric acid and the ozone. Here, the path that the chemical solution circulates to the first filter 141 is referred to as a third circulation path. It is desired that the processing time be from about 0 minutes to about 5 minutes. The second ozone gas injecting valve 322 is opened at the same time as the opening and closing of the switching valves 112, 113, and 114 are changed. As a result, the ozone gas is interfused with the chemical solution through the gas introducing jig 34. At this time, it is desired that the flow rate of the ozone gas be from about 1 L to about 5 L. Then, through use of the chemical solution in which the sulfuric acid and the ozone gas are reacted, circulation cleaning is performed on the first filter 141 on which the resist is adhered. Therefore, the first filter 141 is able to be in a clean state at the initiation of the next batch processing.

Step 7

When the preset time is over, the semiconductor substrate 1 is placed out of the processing tank 12 into a pure water tank filled with pure water, and the chemical solution components that are remaining on the surface of the semiconductor substrate 1 are removed. At this time, the settings of the valves are switched to have the following states: the first switching valve 112 is open; the second switching valve 113 is open; and the third switching valve 114 is closed. The supply of the ozone gas is to be stopped at this point of time, and therefore the second ozone gas injecting valve 322 is closed.

Step 8

The semiconductor substrate 1 is moved out of the pure water tank and is placed into a drying device to be dried therein.

The example of the sequence ends with this step.

As described above, in general, one processing cycle is as follows. The chemical solution having the ozone gas introduced therein is circulated through a first circulation line that passes through the first circulation pump 131 and the first filter 141. Then, when the resist is dissolved in the processing tank 12 through resist stripping, there is performed circulation in which the chemical solution having the ozone gas introduced therein is circulated through a second circulation line that passes through the second circulation pump 132 and the second filter 142, to thereby be returned into the processing tank 12. At the same time, the ozone gas is introduced into a third circulation line that passes through the first circulation pump 131, the first filter 141, and the gas introducing jig 34, to clean the first filter 141.

Figure 4:
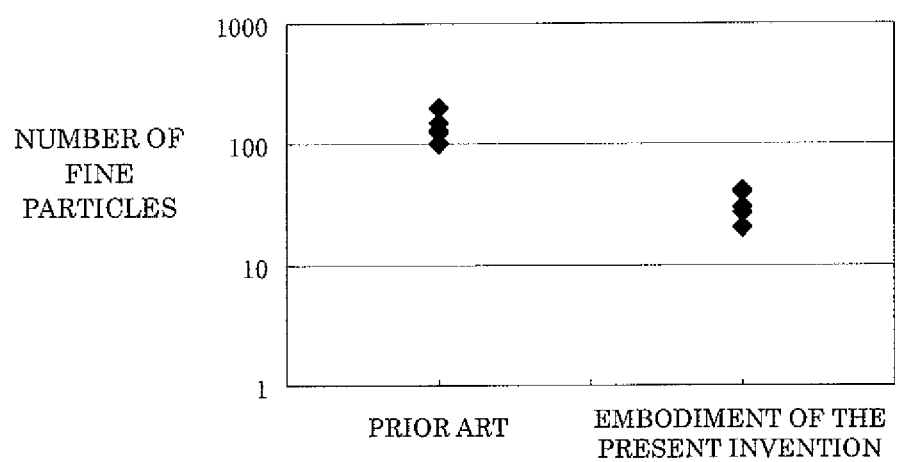
FIG. 4 is a diagram for showing a comparison of the number of remaining fine particles between a case where processing is performed using the semiconductor-substrate processing apparatus according to the embodiment of the present invention, and a case using the related art.

FIG. 4 is a diagram for showing the number of remaining fine particles when processing is performed using the semiconductor-substrate processing apparatus according to the present invention. The number of fine particles remaining on the semiconductor substrate surface after the processing is compared between a case where the related art is used and a case where the present invention is used. According to this diagram, it is apparent that the number of fine particles remaining on the semiconductor substrate surface decreases through use of the present invention.

What is claimed is:

1. A method of stripping a photoresist adhered to a semiconductor substrate, the method comprising:
    circulating a chemical solution having ozone gas introduced therein through a first circulation path that passes through a processing tank, a first circulation pump and a first filter in the stated order;
    immersing the semiconductor substrate to which the photoresist is adhered in the processing tank; and
    circulating the chemical solution having ozone gas introduced therein after dissolution of the photoresist in the processing tank, through a second circulation path that passes through the processing tank, a second circulation pump and a second filter in the stated order so that the chemical solution returns to the processing tank while cleaning the first filter by introducing ozone gas into the chemical solution circulating through a third circulation path that passes through the first circulation pump, the first filter, and a gas introducing jig.

2. The method of stripping a photoresist adhered to a semiconductor substrate according to claim 1; wherein the cleaning the first filter is carried out by introducing ozone gas into the chemical solution circulating through the third circulation path that passes through the first circulation pump, the first filter and the gas introducing jig and does not pass through the processing tank.

3. The method of stripping a photoresist adhered to a semiconductor substrate according to claim 1; wherein the third circulation path is a closed loop path.

4. A method of manufacturing a semiconductor device arranged on a semiconductor substrate, the method comprising:
    preparing a semiconductor device arranged on a semiconductor substrate on which a photoresist is adhered; and
    stripping the photoresist from the semiconductor substrate, the stripping the photoresist from the semiconductor substrate comprising:
    circulating a chemical solution having ozone gas introduced therein through a first circulation path that passes through a processing tank, a first circulation pump and a first filter in the stated order;
    immersing the semiconductor substrate to which the photoresist is adhered in the processing tank; and
    circulating the chemical solution having ozone gas introduced therein after dissolution of the photoresist in the processing tank, through a second circulation path that passes through the processing tank, a second circulation pump and a second filter in the stated order so that the chemical solution returns to the processing tank while cleaning the first filter by introducing ozone gas into the chemical solution circulating through a third circulation path that passes through the first circulation pump, the first filter, and a gas introducing jig.

5. The method of manufacturing a semiconductor device arranged on a semiconductor substrate according to claim 4; wherein the cleaning the first filter is carried out by introducing ozone gas into the chemical solution circulating through the third circulation path that passes through the first circulation pump, the first filter and the gas introducing jig and does not pass through the processing tank.

6. The method of manufacturing a semiconductor substrate arranged on a semiconductor substrate according to claim 4; wherein the third circulation path is a closed loop path.

* * * * *